United States Patent [19]

Schaedeli et al.

[11] Patent Number: 5,776,657
[45] Date of Patent: Jul. 7, 1998

[54] WET-CHEMICAL DEVELOPABLE, ETCH-STABLE PHOTORESIST FOR UV RADIATION WITH A WAVELENGTH BELOW 200 NM

[75] Inventors: Ulrich Schaedeli, Plasselb; Manfred Hofmann, Marly, both of Switzerland; Norbert Muenzel, Heltersheim, Germany; Arnold Grubenmann, Marly, Switzerland

[73] Assignee: OCG Microelectronic Materials, Inc., Norwalk, Conn.

[21] Appl. No.: 614,613

[22] Filed: Mar. 14, 1996

[30] Foreign Application Priority Data

Mar. 15, 1995 [EP] European Pat. Off. ............. 95810170

[51] Int. Cl.[6] ..................................................... G03F 7/033
[52] U.S. Cl. ........................... 430/281.1; 430/286.1; 430/287.1; 430/285.1
[58] Field of Search ............................. 430/281.1, 286.1, 430/287.1, 285.1

[56] References Cited

U.S. PATENT DOCUMENTS

| | | | |
|---|---|---|---|
| 4,440,850 | 4/1984 | Paul et al. | 430/281.1 X |
| 4,690,838 | 9/1987 | Hiraoka et al. | 427/343 |
| 4,849,320 | 7/1989 | Irving et al. | 430/281.1 X |
| 5,248,734 | 9/1993 | Ober et al. | 525/332.1 |
| 5,369,200 | 11/1994 | Schaedeli et al. | 526/262 |

FOREIGN PATENT DOCUMENTS

| | | | |
|---|---|---|---|
| 58-216243 | 12/1983 | Japan | 430/287.1 |

OTHER PUBLICATIONS

Kim et al, Chemical Abstract 119:118924 of J. Macromol. Sci., Pure Appl. Chem. (1993), A30(12), 877–97.

Primary Examiner—Cynthia Hamilton
Attorney, Agent, or Firm—Ohlandt, Greeley, Ruggiero & Perle

[57] ABSTRACT

Photoresist compositions are described, which are sufficiently transparent in the solvent-free state for radiation of a wavelength of approximately 193 nm, and which contain nonaromatic chemical groups, which can be converted into groups with aromatic structural elements (latent aromatic groups) under process conditions, for which an image structure comprised of the resist material is not disrupted. A preferred component with latent aromatic groups is bicyclo [3.2.2]nona-6,8-dien-3-one Resist coatings, which are produced with these compositions, show a stability in plasma etching, which is comparable with the stability of conventional resists based on phenolic resins.

8 Claims, No Drawings

5,776,657

WET-CHEMICAL DEVELOPABLE, ETCH-STABLE PHOTORESIST FOR UV RADIATION WITH A WAVELENGTH BELOW 200 NM

BACKGROUND OF THE INVENTION

1. Field of the Invention

The invention concerns a photoresist composition for UV irradiation with a wavelength below 200 nm, and a process for the lithographic treatment of a substrate.

2. Brief Description of Prior Art

In the case of the microlithographic production of structures on a substrate, as is known, the substrate, e.g., silicon, silicon oxide or silicon nitride is coated with a photoresist composition and this coating is selectively irradiated with radiation of a suitable wavelength, so that the irradiated resist material has a different solubility than the unexposed material in a developer solution. The irradiated coating is finally treated with the developer, whereby it is structured as an image on the basis of the different solubilities. The imaged coated substrate can then be subjected to a further treatment on those places free of the resist. Frequently, this involves a plasma etching (e.g., a silicon oxide or silicon nitride substrate is etched with a halogen/oxygen plasma mixture, e.g., a $Cl_2$—$O_2$ or a $CF_4$—$F_2$ plasma) against which the resist coating must be sufficiently stable. The microlithographically maximally obtainable resolution is determined essentially by the radiation wavelengths used for the selective irradiation. For some time now, the use of deep UV radiation has been employed for many applications, particularly the application of radiation with a wavelength of 200–250 nm. For example, radiation of 248 nm is broadly utilized and this can be produced with krypton fluoride excimer lasers.

The resolution capacity that can be obtained with conventional deep UV microlithography, however, has its limits. It permits structures with dimensions down to approximately 0.20 μm to be resolved. However, the targeted production most recently of 4 gigabyte storage elements, for example, or of similarly highly-integrated electronic components requires the formation of essentially smaller structural elements, which have minimal dimensions of down to approximately 0.12 μm. In order to be able to sufficiently resolve optically such small structural elements, wavelengths shorter than deep UV radiation must be utilized. In particular, the radiation of argon fluoride excimer lasers, which has a wavelength of 193 nm is considered for this purpose. The deep UV photoresist material that can be used today, however, is not suitable for 193 nm radiation. That current material is based usually on phenolic resins as a binding agent, particularly on novolak resins or on polyhydroxystyrene derivatives, which have too high an absorption at wavelengths below 200 nm, due to their aromatic structural elements. This high absorption leads to the result with 193 nm radiation that the side walls of the finished developed resist structures do not form the desired vertical profiles. But instead a more or less oblique angle with the substrate or with the resist surface is obtained which causes poor optical resolution characteristics at the application of these short-wave radiation.

It has thus been proposed to utilize photoresists based on methacrylate resins for the production of structures by means of 193-nm radiation (See Roderick R. Kunz et al. "RESIST PROCESS FOR ArF EXCIMER LASER LITHOGRAPHY", Journal of Photopolymer Science and Technology, Vol. 6 (1993), pp. 473–490). Such photoresists have in fact proven sufficiently transparent for this radiation, but they do not have the etching stability customary for resists based on phenolic resins in the case of plasma etching. That etching stability is based essentially on the aromatic groups in the novolak-containing resists (See James R. Sheats: "PHOTORESISTS FOR DEEP UV LITHOGRAPHY", SOLID STATE TECHNOLOGY, 1989, pp. 79–86).

There have also been several attempts to reduce this problem. For example, it has been attempted to improve the etching stability of photoresists based on meth(acrylate) by introducing cycloaliphatic groups into the meth(acrylate) polymers (See Robert D. Allen et al. "SINGLE LASER RESISTS WITH ENHANCED ETCH RESISTANCE FOR 193 nm LITHOGRAPHY", Journal of Photopolymer Science and Technology, Vol. 7 (1994), pp. 507–516). This in fact leads to an improvement in etching stability, but not to the desired extent. Thus, for example, the etching rate of poly(isobornyl)acrylate in oxygen or chlorine plasma is still approximately 50–70% higher than that of novolak resins (See Roderick R. Kunz et al. "RESIST PROCESS FOR ArF EXCIMER LASER LITHOGRAPHY", Journal of Photopolymer Science and Technology, Vol. 6 (1993), pp. 473–490).

Another proposal aims at producing a sufficient etching stability only after irradiation in the resist coating. For this purpose, it has been proposed to treat the substrate with the finished, developed, image-structured photoresist coating in a suitable way with specific alkyl compounds of magnesium or aluminum, in order to introduce the given metals in the resist material in this way as etching barriers (See U.S. Pat. No. 4,690,838). The use of metal-containing reagents, however, is generally not desired in the case of the microlithography process, due to the danger associated therewith of a contamination of the substrate with metal ions.

In addition, nonaromatic chemical compounds which can be converted in a relatively simple way into compounds with aromatic groups (designated below also as "latent aromatic compounds"), are known. Bicycle|3.2.2|nona-6,8-dien-[3]-one reacts this way under acid catalysis to form phenyl acetone (See A. E. Hill et al. "ONE STAGE SYNTHESIS OF BICYCLO[3.2.2]NONA-6,8-DIEN-3-ONES", Journal of the American Chemical Society, Vol. 96 (1974), pp. 4597–4603) as do also specific poly(cyclohexadiene carbonates) and acetates also under acid catalysis or also only upon heating to form polyphenylenes (See U.S. Pat. No. 5,248,734).

A chemically reinforced positive photoresist for application in the deep UV region, which comprises poly (cyclohexa-1,3-dien-5,6-diacetate) and triphenylsulfonium trifluorosulfonate as radiation-sensitive acid donors, has also been described (See Japanese Published Patent Application No. 05/06119). After exposure with 248 nm radiation and removal of the irradiated parts of the resist layer with an alkaline developer solution, the substrate is heated with the image-structured resist coating according to the instructions of this document to 200° C., so that the poly(cyclohexa-1, 3-diene-5,6-diacetate) reacts in the remaining part of the coating to form polyphenylene. The named photoresist shows a good transparency for the radiation of 248 nm wavelength and a good stability with a later plasma etching.

It has now been found that by means of latent aromatic compounds, photoresist compositions can be formulated, which produce a resist coating, which is still sufficiently transparent for radiation with a wavelength of approximately 193 nm and which, however, is sufficiently stable in plasma etching after conversion of the latent aromatic groups to aromatic groups. This was unexpected, particularly since the known latent aromatic groups contain isolated carbon double bonds, which, as is known, show a strong absorption band at approximately 190–200 mm. In this way, it is possible for the first time to formulate a wet-chemical, developable photoresist for radiation of approximately 193 nm wavelength, which shows an etching rate that is comparable to conventional resists based on phenolic resin, and this is true without needing to treat the resist coating with metal compounds in order to increase the etching stability.

BRIEF SUMMARY OF THE INVENTION

The subject of the present invention is therefore a photoresist composition, which is sufficiently transparent in the solvent-free state for radiation of a wavelength of approximately 193 nm, and which contains nonaromatic chemical groups that can be converted into groups with aromatic structural elements under process conditions, in which an image-type structure comprised of the resist material is not disturbed. These groups are denoted in the following also as latent aromatic groups.

DETAILED DESCRIPTION OF THE PREFERRED EMBODIMENTS

A modern photoresist for the submicron region is usually viewed as sufficiently transparent for a specific radiation, if its extinction at the wavelength of the radiation, based on a resist thickness of 1 micrometer, does not exceed a value of approximately 0.8, and preferably of 0.5. The quantity $E=\log(I_0/I)$ is hereby designated as extinction, in which $I_0$ is the intensity of radiation before the photoresist layer and I is the intensity of radiation after the photoresist layer. An extinction of 0.8 μm (0.5 μm) indicates that photoresist a film of 1 μm thickness can pass approximately one-fifth (one-third) of the radiation, i.e., shows a transmission value $T=10^{-E}$ of 0.16 (0.3). If a photoresist has a greater extinction than 0.7 μm in the case of the radiation used for exposure, then the angles that form the side walls of the resist profile with the substrate generally show a very strong deviation from the desired 90° and often lie in the 80° region. The precise value of extinction of a photoresist can be simply determined by introducing, e.g., a resist layer of known thickness onto a suitable quartz carrier, introducing the carrier into a UV spectrometer, and plotting a UV spectrum.

In principle, it does not matter which component of the resist contains the latent aromatic groups for the formulation of the photoresist according to the invention, as long as the groups are present in sufficient quantity in the resist, so that the formed aromatic groups produce the desired low etching rate. For example, the binder or a part of the binder of the resist may contain latent aromatic groups as side groups or in the main chain, or even in both. Polymers with latent aromatic groups in the main chain may be selected, e.g., from the polymers and copolymers based on 1,2-disubstituted polycyclohexa-3,5-diene monomers described in U.S. Pat. No. 5,248,734. Those polymers and copolymers from the named reference, whose main chain contain the same or different structural groups of the following formula (I):

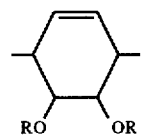

in which the residue R indicates the same or different residues selected from hydrogen, $C_1$–$C_5$ alkyl, $C_1$–$C_{10}$ alkanoyl and —$COOC_1$—$C_{10}$ alkyl, as well as, if needed, divalent residues of other copolymerized monomers without aromatic or conjugated unsaturated groups, are suitable for the present invention. In the case of the named copolymers, the molar ratio of units of formula (I) and comonomer units can generally lie between 1:1 and 1:100. As comonomers, e.g., simple unsaturated olefins, particularly vinyl compounds, acrylates, methacrylates, acrylamides, methacylamides or maleinimides are included, which have no aromatic or conjugated unsaturated groups.

Polymers with latent aromatic side groups may also be produced in a simple way, for example, by the polymerization of latent aromatic monomers with vinyl groups. For example, phenyl vinyl ethers can be converted with 2-methoxyallyl bromide according to the instructions of A. E. Hill et al. indicated below and then polymerized, or (meth)acrylic acid polymers or copolymers can be converted with cis-3-methyl-3,5-cyclohexadiene-1,2-diol. The polymeric latent aromatic compounds have the advantage that a diffusing out of the latent aromatic substances, which is combined under certain circumstances with a reduction in the etching stability is practically excluded.

Another form of embodiment of the resist according to the invention contains the latent aromatic compound as a separate component particularly for this purpose, since one is in a position to vary the components of the latent aromatic substances in a simple way and to a relatively great extent independently from the components of the resist, which have other functions, adversely influencing, in an ill-timed and undesired manner, other important properties of the resist. Thus, resists that contain bicyclo[3.2.2.]nona-6,8-dien-3-one as a latent aromatic compound are particularly preferred according to the invention. The production of bicyclo[3.2.2.]nona-6,8-dien-3-one is, for example, possible, by reaction of 2-methoxyallyl bromide with benzene according to the instructions in the article of (See A. E. Hill et al. "ONE STAGE SYNTHESIS OF BICYCLO[3.2,2]NONA-6.8-DIEN-3-ONES"), Journal of the American Chemical Society, Vol. 96 (1974), pp. 4597–4603). A particular advantage of this type of compound in comparison to poly(cyclohexadiene) derivatives, as they are mentioned in the initially cited U.S. Pat. No. 5,248,737, consists of the fact that the aromatization is based on a weight-neutral chemical rearrangement, in contrast to an elimination reaction that is the case for compounds according to U.S. Pat. No. 5,248,737, with which a volume loss generally occurs, which may lead to undesired changes in the resist profile.

A multiplicity of compound types are considered for the acid-induced aromatization, for example, the reaction products described by McKeown et al. of fumaronitrile and cyclic dienes or also cis-3-methyl-3,5-cyclohexadien-1,2-diol, whose maximum extinction increases in the presence of acid from 0.6 μm probably since phenol is formed with elimination of water.

In the case of different types of latent aromatic components, it is obvious that their proportion can vary within wide limits in the resists according to the invention. Basically with respect to the quantity, it is only necessary that the resist is still sufficiently transparent at 193 nm and at the same time, a sufficient etching stability is achieved. The expert can determine the upper and lower limits for a specific latent aromatic components without much expenditure, by just a few routine tests. Photoresists, whose etching rate is as small as possible for a specific plasma according to the invention, are preferred, or, particularly preferred, is one that corresponds to a conventional photoresist based on novolak. Preferably, the photoresists according to the invention contain latent aromatic groups, e.g., in a quantity such that the etching rate of the resist in the oxygen plasma amounts to 150–100 (±10) nm/min.). A conventional photoresist based on novolak, e.g., Micoposit® 1350 of the Shipley Company, in oxygen plasma shows an etching rate of approximately 105 (±10) nm/min., determined with a plasma etching device of the type Alcatel CF 2P® (Flow:10 s·cm³; RF power:30W;O₂pressure:2.0 PA and bias:420 V).

Depending on their components, the photoresists according to the invention are either positive resists or negative resists. Preferably, in both cases, they involve chemically reinforced photoresists, i.e., photoresists which contain groups that form a strong acid under the effect of radiation (denoted below also as "radiation-sensitive"acid donors) as well as groups, which change the solubility of the resist in a desired developer solution under the catalytic effect of this acid. The named groups may be a part of one or different components of the resist.

Negative resists, whose material is soluble in a developer solution, as is known, in the nonirradiated state, but is insoluble in the irradiated state, generally contain either groups that cross-link directly under the effect of the radiation, or, in the case of chemically reinforced photoresists, cross-link groups that form a strong acid under the effect of radiation as well as groups that are catalyzed by this acid, whereby in both cases, the cross-linking makes the resist insoluble in conventional solvents. The type of cross-linkable compound is not critical, as long as one provides for its absorption behavior for radiation of approximately 193 nm. For example, appropriate polyfunctional (meth) acrylates are suitable as cross-linkable components, which are familiar to the expert. The type of radiation-sensitive acid donor is also not critical, and all respective compounds known to the expert can be utilized, such as the substances described below for this purpose in connection with positive resists. The radiation-sensitive acid donor is generally utilized only in relatively small quantities, for example, in a quantity of 0.01 to 10, particularly 0.1 to 5 wt. %.

Particularly preferred, however, are positive photoresists according to the invention, i.e., resists whose material is relatively insoluble in a developer solution in the nonirradiated state, but, on the other hand, is soluble in the irradiated state, so that the irradiated parts may be dissolved by means of the developer and can be removed from the substrate. Most particularly preferred are positive resists, whose material is insoluble in the nonirradiated state in aqueous alkaline developers, whereas it is soluble in these developers in the irradiated state. Further, chemically reinforced positive photoresists are preferred, thus resists containing groups that form an acid under the effect of radiation, as well as groups that improved the solubility of the resist in aqueous alkaline developers under the catalytic effect of this acid.

In the case of groups increasing the solubility in aqueous alkaline media in an acid-catalytic manner, we are generally dealing with groups that can be cleaved by acid catalysis, whereby one or more residues are formed with functional groups, which increase the solubility of the resist in aqueous alkali so strongly that the exposed parts of the resist can be removed from a substrate. Groups that can be cleaved by acid catalysis are known in many forms and all may generally be applied, as long as they do not contain strongly absorbing atomic groups below 200 nm, since otherwise the resist would have an undesired absorption characteristic. For example, these may be groups of the formula —OR₁, in which R₁ stands for C₄–C₁₀-tert-alkyl, unsubstituted allyl, cyclohex-2-enyl, trialkyl silyl or these compounds substituted by one or more C₁–C₆ alkyl groups, C₁–C₆ alkoxy groups or halogen atoms, or for a group of the following formulas:

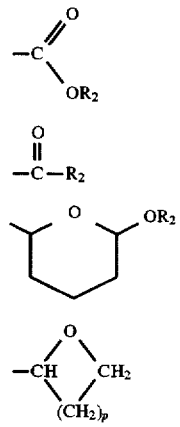

in which R₂ stands for C₁–C₆ alkyl and p stands for a number 4 or preferably 3 or 2. The groups that can be cleaved by the acid can be bonded in principle to all components of the resist of the invention. However, the binding agent particularly preferably contains groups that can be cleaved by acid catalysis. However, it is also possible to add an additional component with groups that can be cleaved by acid catalysis as a solution inhibitor to the resists of the invention in combination with an alkali-soluble binding agent, whereby the solution inhibitors prevent the dissolution of the nonirradiated resist material in aqueous alkaline developer media.

A preferred form of embodiment of the resists according to the invention concerns chemically reinforce positive photoresists that can be developed in aqueous alkaline media, which contain the following components:

A) a compound, which forms a strong acid under the effect of radiation;

B) a film-forming binding agent that is sufficiently transparent for radiation of approximately 193 nm wavelength, which has groups that can be cleaved by acid; and C) a compound with latent aromatic groups; or instead of components (B) and (C);

D) a film-forming binding agent, which is sufficiently transparent for radiation of approximately 193 nm wavelength, which has groups that can be cleaved by acid catalysis and latent aromatic groups.

The named photoresists contain component A generally in a quantity of 0.01–10 wt. % with respect to the total weight of components A, B, and C. Preferred, however, are generally relatively small quantities of radiation-sensitive acid donors, e.g., 0.01 to 6, and particularly 0.1 to 3 weight percent. Component B generally makes up 50 to 85 weight percent of components A, B, and C, while the latent aromatic compound makes up approximately 15–40 weight percent of these components.

All known compounds which form acid under the action of actinic radiation, can be utilized as component A. A large number of such compounds are named, e.g., in European Published Patent Application No. 0,601,974 (equivalent to U.S. Pat. No. 5,369,200), whose description will also be a component of this description. Preferred radiation-sensitive acid donors are onium salts, such as diazonium, sulfonium, sulfoxonium, and iodonium salts, as well as disulfones and compounds of the formula:

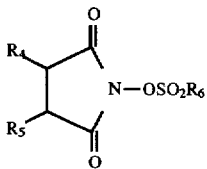

in which $R_4$ and $R_5$ are independent of one another and stand for $C_1-C_4$ alkoxy or phenyl or indicate together a residue of the following three formulas:

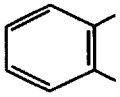

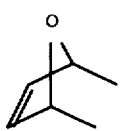

and $R_6$ represents unsubstituted $C_1-C_{12}$ alkyls or the same substituted by halogen, nitro, or $C_1-C_4$ alkoxy, or unsubstituted phenyl or phenyl substituted by halogen, nitro, $C_1-C_4$ alkyl or $C_1-C_4$ alkoxy.

Particularly preferred are sulfonium salts of the formula (II):

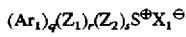 (II)

in which

Ar$_1$ is unsubstituted phenyl, naphthyl or phenyl COCH$_2$ or these compounds substituted by halogen, $C_1-C_4$ alkyl, $C_1-C_4$ alkoxy, OH and/or nitro;

Z$_1$ is $C_1-C_6$ alkyl or $C_3-C_7$ cycloalkyl; and

Z$_2$ is tetrahydrothienyl, tetrahydrofuryl, or hexahydropyryl;

q stands for 0, 1, 2, or 3;

r stands for 0, 1, or 2; and s stands for 0 or 1, whereby the sum q+r+s amounts to 3; and $X_1^\ominus$ is a chloride, bromide, or iodide anion, $BF_4^\ominus$, $PF_6^\ominus$, $AsF_6^\ominus$, $SbF_6^\ominus$, $FSP^\ominus$, or the anion of an organic sulfonic acid or carboxylic acid.

Phenyl, naphthyl, and phenacyl groups Ar$_1$ are preferably simply substituted, particularly by Cl, Br, methyl, methoxy, OH, or nitro. It is particularly preferred if these residues are unsubstituted. Z$_1$ is preferably $C_1-C_4$ alkyl, particularly methyl or ethyl. It is preferred that q is 2 or 3, r is 1 or zero, and s is zero, particularly that q is the number 3 and r and s are zero. It is most particularly preferred that Ar$_1$ is unsubstituted phenyl and q is 3.

If $X_1^\ominus$ represents the anion of an organic sulfonic acid or carboxylic acid, then it may involve anions of aliphatic, cycloaliphatic, carbocyclic-aromatic, heterocyclic-aromatic, or araliphatic sulfonic or carboxylic acids. These anions may be substituted or unsubstituted. Sulfonic and carboxylic acids with a small nucleophilic character are preferred, for example, partially fluorinated or perfluorinated derivatives or derivatives substituted for the respective acid group in the neighboring position. Examples for substitutes include halogen, such as chlorine or particularly fluorine, alkyls, such as methyl, ethyl or n-propyl, or alkoxys, such as methoxy, ethoxy or n-propoxy.

Preferably in the case of $X_1^\ominus$ these involve the monovalent anion of an organic sulfonic acid, particularly a partial fluoro or perfluoro sulfonic acid. These anions are characterized by a particularly small nucleophilic character.

Special examples for suitable sulfonium salts of formula (II) are triphenylsulfonium bromide, triphenylsulfonium chloride, triphenylsulfonium iodide, triphenylsulfonium hexafluorophosphate, triphenylsulfonium hexafluoroantimonate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, and 4-nitrophenacyltetrahydrothiophenium chloride, and 4- and 4-hydroxy-2-methylphenyl hexahydrothiopyrylium chloride. Particularly preferred is triphensylsulfonium trifluoromethanesulfonate (triphenylsulfonium triflate).

One uses in a particularly preferred manner as component A, those compounds of the above formula (II), in which Ar$_1$ indicates phenyl q is the number 3, r and s are zero, and $X_1^{63}$ is $SbF_6^\ominus$, $AsF_6^\ominus$, $PF_6^\ominus$, $CF_3SO_3^\ominus$, $C_2F_5SO_3^\ominus$, $n-C_3F_7SO_3^\ominus$, $n-C_4F_9SO_3^\ominus$, $n-C_6F_{13}SO_3^\ominus$, $n-C_8F_{17}SO_3^\ominus$, or $C_6F_5SO_3^\ominus$.

Polymers and copolymers of simple unsaturated olefins soluble particularly in aqueous alkaline developers are considered as binding agent component B, particularly vinyl compounds, of simple unsaturated carboxylic acids, particularly acrylic acid and methacrylic acid, of acrylates, methacrylates, acrylamides, methacrylamides, or of maleinimides, which have been made insoluble in aqueous alkaline media by introduction of a sufficient quantity of suitable groups that can be cleaved by acid catalysis. Copolymers of one or more of the name monomer types, particularly of methacrylates, with acrylic and particularly methacrylic acid are preferably concerned, whereby a sufficient portion of the free carboxylic groups of arcylic acid and methacrylic acid units is converted to groups of the formula —COOR$_3$, whereby R$_3$ stands for $C_4-C_{10}$-tert-alkyl, unsubstituted allyl, cyclohex-2-enyl, trialkylsilyl, or these compounds substituted by one or more $C_1-C_6$ alkyl groups, $C_1-C_6$ alkoxy groups, or halogen atoms, or stands for a group of the formulas:

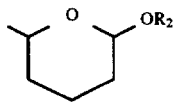

-continued

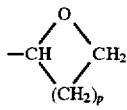

"und"=and in which $R_2$ stands for $C_1$–$C_6$ alkyl and p stands for one of the numbers 4, or preferably 3 or 2. In a particularly preferred way, $R_3$ indicates a $C_4$–$C_{10}$tert-alkyl group, particularly a tert-butyl group or a group of the formula:

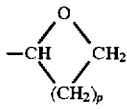

in which p indicates 3 or 2.

Terpolymers of methylmethacrylate, methacrylic acid, and acid-cleavable methacrylic acid esters of the formula $H_2C=C(CH_3)$—$COOR_3$, in which $R_3$ has one of the above-named meanings and particularly represents a tert-butyl or a tetrahydropyranyl group, are particularly preferred binding agents for the above named chemically reinforced positive photoresists that can be developed in aqueous alkaline media. These polymers preferably contain methylmethacrylate that can be developed in aqueous alkaline media. These polymers preferably contain methylmethacrylate structural groups of up to approximately 40–50 molar percent, and thus the polymer, among other things, shows good film-forming properties, and approximately 10–25 molar percent methacrylic acid, while the remainder of the polymer is formed by acid-cleavable methacrylic acid esters.

Finally, a chemically reinforced photoresist that can be developed in aqueous alkaline media is particularly preferred, which contains a radiation-sensitive acid donor, as component B of one of the above-described terpolymers of methylmethacrylate, methacrylic acid, and acid-cleavable methacrylic acid esters of the formula $H_2C=C(CH_3)$—$COOR_3$ and bicyclo[3.2.2]nona-6,8-dien-3-one as the latent aromatic compound, whereby the weight ratio of component B to the latent aromatic compound lies between 4:1 and 1.5:1.

All of the photoresists according to the invention may also contain suitable conventional additives, such as, e.g., stabilizers, pigments, coloring agent, fillers, adhesion mediators, leveling agents, wetting agents, and softeners.

The photoresist compositions are preferably dissolved in a suitable solvent for application. The selection of the solvent and the concentration are adjusted primarily according to the type of composition and according to the coating process. The solvent will be inert, i.e., it will not enter into any chemical reaction with the components, and it can be removed again upon drying after coating. Suitable solvents are, e.g., ketones, ethers and esters, such as methyl ethyl ketone, 2-heptanone, cyclopentanone, cyclohexanone, γ-butyrolactone, ethylpyruvate, diethyleneglycol dimethyl ether, 2methoxyethanol, 2-ethoxyethanol, 2-ethoxyethyl acetate, 1-methoxy-2-propyl acetate, 1.2dimethoxyethane, acetic acid ethyl ester, and 3-methoxymethyl propionate, or mixtures of these solvents.

The photoresist compositions dissolved in a solvent are excellently suitable as coating agents for substrates of all types, particularly for metals, such as Al, Cu, Ni, Fe, Zn, Mg, or Co, and for GaAs, Si, or $SiO_2$, onto which an image will be introduced exposure to light to create an image.

Another subject of the invention is a process for the treatment of a substrate, which comprises at least the following process steps:

(1) coating the substrate with a photoresist composition,
(2) selective irradiation of this photoresist coating, and
(3) treatment of the irradiated coating with a developer solution, whereby the resist coating is structured as an image;

whereby (a) the photoresist coating is sufficiently transparent for irradiation with wavelength of approximately 193 nm and contains nonaromatic chemical groups, which can be converted into groups with aromatic structural elements under process conditions in which an image-type structure comprised of the resist material is not disrupted;

(b) a radiation of approximately 193 nm wavelength is utilized for the selective radiation of the photoresist coating; and (c) the image-structured resist coating is subject to a treatment, in which its image-type structure is not disturbed, and for which the named nonaromatic groups are converted to groups with aromatic structural elements.

A chemically reinforced resist is preferably applied in this process, particularly a chemically reinforced positive photoresist that can be developed by an alkali.

For conducting the process of the invention, the photoresist composition is introduced uniformly onto a substrate by means of known coating processes, e.g., by spinning, dipping, doctor coating, curtain casting process, painting, spraying, particularly by electrostatic spraying and reverse-roll coating.

The quantity applied (layer thickness) and the type of substrate (carrier layer) depend on the desired field of application. The layer thickness region comprises in general values of approximately 0.1 μm up to more than 10 μm.

After coating, the solvent is generally removed by drying, whereby a photoresist coating is obtained on the carrier.

The present invention is further illustrated by the following Examples. All parts and percentages are by weight and all temperatures are degrees Celsius unless explicitly stated otherwise.

EXAMPLES

Radiation-sensitive compositions according to the invention are suitable as photoresists for electronics (galvanoresist, etching resist, solder stop resist), for the production of printing plates, such as offset printing plates or serigraphy plates, for application in molded part etching, but particularly for application as a microresist for the manufacture of integrated circuits.

The possible substrates and the processing conditions of the coated substrates are different depending on the various fields of application. For example, specially treated aluminum serves as a substrate for offset printing plates, copper-lined laminates serve for the production of printed circuits, and silicon wafers serve for the production of integrated circuits. The layer thicknesses generally are approximately 0.5 μm to 10 μm for offset printing plates, 0.4 to approximately 2 μm for printed and integrated circuits, and particularly 0.4 to 1 μm for integrated circuits.

For producing relief structures, the substrate coated with the photoresist according to the invention is selectively exposed, i.e., in an image-producing manner. The exposure is thus produced with an argon fluoride excimer laser with 193-nm radiation, either through a mask, preferably a chromium-quartz mask, or by moving the laser beam in a computer-controlled manner over the surface of the coated substrate, and thus an image is generated. Here, the high sensitivity of the photoresist materials according to the invention is very advantageous, which permits high writing speeds at relatively low intensities.

The high sensitivity of the resist is also of advantage for exposure by means of steppers, where very short exposure times are desired.

With the use of these chemically reinforced resists, the described process preferably includes a heating of the coating as another process measure, preferably between selective irradiation and treatment with the developer. By means of this heat treatment, the so-called "post-exposure bake", a practically complete reaction of the resist material is obtained in a particularly rapid time. The duration and the temperature of this post-exposure bake may be varied within broad limits and essentially depends on the composition of the resist, particularly on the type of its acid-sensitive components and the type of radiation-sensitive acid donor used, as well as on the concentration of these two components. Usually, the exposed resist is subjected for a few seconds to several minutes to temperatures of approximately 50–150° C.

After the image-producing exposure and heat treatment of the material conducted as needed, the more soluble places of the photosensitive resist are removed by dissolving them out in a developer. The selection of the appropriate developer is adapted to the type of photosensitive resist, particularly to the nature of the binding agent used or the photoproducts that are formed.

Aqueous solutions of bases are particularly suitable for the positive resists according to the invention, to which organic solvents or their mixtures may be added also as needed.

Aqueous alkaline solutions, such as are utilized also for the development of novolak-naphthoquinone diazide resist coatings are particularly preferred as developers. Among these are included, e.g., aqueous solutions of alkali-metal silicates, phosphates, hydroxides, and carbonates, but particularly of tetraalkylammonium hydroxide solutions, such as, e.g., of tetramethylammonium hydroxide solution, which are free of metal ions. Smaller amounts of wetting agents and/or organic solvents may also be added to these solutions. Typical organic solvents, which may be added to the developer fluids, are, for example, cyclohexanone, 2-ethoxyethanol, toluene, acetone, isopropanol, ethanol, as well as mixtures of two or more of these solvents.

The conversion of the latent aromatic groups in the resist to groups with aromatic structural elements is produced after the development. This is done generally by heating the image-structured resist coating to temperatures between 90° and 200° C., e.g., by means of a hot plate. The duration of the heating is usually between half a minute and several minutes.

In general, after the development step, the substrate having the image-structured coating is subjected at least to one other treatment step at least on the coated side, which leads to a modification of the substrate on the free places of the substrate. A frequently used structuring procedure is plasma etching, for example, HBr, $CF_4$, chlorine or oxygen plasma. The resist coatings produced according to the invention are characterized by a particularly good etching stability, i.e., by the fact that the plasma attacks the resist material only very slowly and strips it. Further, the resist compositions according to the invention are characterized among other things by good application-technical properties as well as a high thermal stability and a very good resolution capacity in the submicron region.

Then, as an additional process measure, the removal of the structured resist coating from the substrate, e.g., with hot oxygen is conducted as needed.

Another subject of the invention is thus a process for the production of an electronic structural component, which comprises a process for the treatment of a substrate, as has been described above.

Example 1

Production of a terpolymer of methacrylic acid, methylmethacrylate and 2-tetrahydropyranyl methacrylate.

8.51 g (50 mmoles) of 2-tetrahydropyranyl-methacrylate and 2.5 g (25 mmoles) of methylmethacrylate and 2.15 g (25 mmoles) of methacrylic acid and 0.3 g of azobisisobutyronitrile (AIBN) are dissolved in 100 ml of tetrahydrofuran in a 100-ml three-neck volumetric flask. The mixture is stirred for 24 hours at 70° C. under an inert nitrogen atmosphere. The desired terpolymer is isolated by precipitation from 500 ml of methanol. Yield: 11.8 g(90% of the theoretical); Mw=24,300; Mn=8,400, Mw/Mn=2.8).

Coatings of the pure terpolymer are produced as well as the mixtures of terpolymer with bicyclo|3.2.2|nona-6,8-dien-3-one indicated in Table 1 as latent aromatic compounds and 1% triphenylsulfonium triflate with respect to the total solids content, by introducing the appropriate solutions in cyclopentanone onto a substrate, drying, irradiating at a dose of 20 mJ/cm$^2$ and then allowing the reaction for the aromatization for 12 hours at room temperature. The etching rate of the coatings is determined in oxygen plasma by means of a plasma etching device of the type Alcatel CF2P® and compared with a conventional cresol novolak (Novolak Resin P28 of OCG) as well as a commercial positive photoresist based on novolak (Microposit® 1350 of Shipley), whereby the following process conditions were applied: flow=10s·cm$^3$; RF power:30 W;$O_2$ pressure:2 Pa and bias:420 V).

A resist formulation is prepared from 0.74 g of the above-indicated terpolymer, 0.25 g of bicyclo[3.2.2]nona-6, 8-dien-3-one (prepared according to A. E. Hill et al.: "ONE STAGE SYNTHESIS OF BICYCLO[3.2.2]NONA-6,8-DIEN-3-ONES"), Journal of the American Chemical Society, Vol. 96 (1974), p. 4601; ∈ 193nm=3500) and 0.01 g of triphenylsulfonium triflate, dissolved in 4 ml of cyclopentanone. This solution is spun at an rpm of 3000 U/min onto a 3-inch silicon wafer, which is then heated on a hot plate at 60° C. for 1 minute, whereby a resist film of 0.8 μm remains on the substrate, whose extinction at 193 nm amounts to approximately 0.75/μm. The film is exposed through a chromium-quartz mask with minimal structural units of 0.5 μm with radiation of a wavelength of 193 nm to form an image, produced by a Lamda Physics LPF 205® Excimer Laser (ArF mode). After exposure, the substrate is heated on the hot plate for 1 minute at 50° C. and the film is developed with a 0.1N solution of tetramethylammonium hydroxide in water, whereby the previously irradiated regions of the film are dissolved away. Finally, the resulting image-structured resist coating is left for 12 hours at room temperature and aromatized. The etching rate in oxygen plasma is accordingly approximately 140 nm/min.

TABLE 1

| Material | Etching rate [nm/min] | Etching rate, relative[1] |
|---|---|---|
| Cresol novolak P-28 | 90 | |
| Microposit ® 1350 resist | 106 | 1 |
| Terpolymer from Example 1 | 200 | 1.9 |
| Mixtures of terpolymer with latent aromatic substances | | |
| 40 wt. % latent aromatic substances | 105 | 1 |
| 33 wt. % latent aromatic substances | 103 | 1 |
| 20 wt. % latent aromatic substances | 135 | 1.25 |
| 16 wt. % latent aromatic substances | 150 | 1.4 |

[1]with respect to the etching rate of Microposit ® 1350

Example 2

A composition is produced by dissolution of 0.75 g of terpolymer from Example 1, 0.2 g of cis-3-methyl-3,5-cyclohexadien-1,2-diol and 0.05 g of triphenylsulfonium triflate, dissolved in 0.5 g of cyclopentanone. The solution is spun at 2800 rpm onto a quarz wafer, which is dried for one minute at 90° C. on the hot plate, whereby a film of 1 μm thickness remains behind, which has an extinction of 0.7/μm at 193 nm. The film is exposed with a radiation dose of 24 mJ/cm$^2$ and is left to stand for 2 days at room temperature. Then, due to the aromatization, it shows an extinction of 1.6/μm at 193 nm.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A photoresist composition comprising:

(A) a compound which forms an acid under the effect of radiation;

(B) a film-forming binding agent that is sufficiently transparent for radiation of approximately 193 mm wavelength to provide a photoresist from said composition having an extinction value of at most 0.8/μm in a solvent free state and which has groups that can be cleaved by acid catalysis; and (C) a compound with latent aromatic groups.

2. The photoresist composition according to claim 1, which contains as component B a terpolymer of methyl methacrylate, methacrylic acid, and methacrylic acid esters of the formula H$_2$C=C(CH$_3$)—COOR$_3$, in which R$_3$ stands for C$_4$-C$_{10}$ tert-alkyl or allyl, cyclohex-2-enyl, trialkylsilyl that is unsubstituted or substituted by one or more C$_1$-C$_6$ alkyl groups, C$_1$-C$_6$-alkoxy groups or halogen atoms, or for a group of the formulas:

$$\text{structures shown}$$

in which R$_2$ stands for C$_1$-C$_6$ alkyl and p stands for one of the numbers 4, 3 or 2.

3. The photoresist composition according to claim 1, which contains as component A a sulfonium salt of formula (II)

$$(Ar_1)_q(Z_1)_r(Z_2)_s S^\oplus X_1^\ominus \qquad (II),$$

in which

Ar$_1$ is unsubstituted phenyl, naphthyl or phenyl COCH$_2$ or these compounds substituted by one or more of the group consisting of halogen, C$_1$-C$_4$ alkyl, C$_1$-C$_4$ alkoxy, OH and nitro;

Z$_1$ is C$_1$-C$_6$ alkyl or C$_3$-C$_7$ cycloalkyl, and

Z$_2$ is tetrahydrothienyl, tetrahydrofuryl or hexahydropyryl;

q stands for 0, 1, 2 or 3;

r stands for 0, 1 or 2; and s stands for 0 or 1, whereby the sum q+r+s amounts to 3; and X$_1^\ominus$ is a chloride, bromide, or iodide anion, BF$_4^\ominus$, PF$_6^\ominus$, AsF$_6^\ominus$, SbF$_6^\ominus$, FSO$^\ominus$ or the anion of an organic sulfonic acid or carboxylic acid.

4. The photoresist composition of claim 1 wherein the component (C) is bicyclo[3.2.2]nona-6,8-dien-3-one.

5. The photoresist composition of claim 4 wherein the weight ratio of component (B) to said bicyclo[3.2.2]nona-6,8-dien-3-one is between 4:1 and 1.5:1.

6. The photoresist composition of claim 1 wherein said binding agent (B) is a polymer or copolymer of an unsaturated monomer.

7. The photoresist composition of claim 6 wherein said unsaturated monomer is selected from the group consisting of acrylic acid, methacrylic acid, acrylate, methacrylate, acrylamide, methacrylamide and maleinimide.

8. The photoresist composition of claim 1 wherein said photoresist composition comprises 0.01 to 10% by weight component (A); 50 to 85% by weight component (B); and 15 to 40% by weight component (C); all weight % based on the total weight of (A), (B) and (C).

* * * * *